(12) United States Patent
Kim

(10) Patent No.: US 8,823,161 B2
(45) Date of Patent: Sep. 2, 2014

(54) SEMICONDUCTOR CHIP, SEMICONDUCTOR PACKAGE, AND METHOD FOR MANUFACTURING SEMICONDUCTOR CHIP FOR REDUCING OPEN FAILURES

(75) Inventor: Seong Cheol Kim, Anseong-si (KR)

(73) Assignee: SK Hynix Inc., Gyeonggi-do (KR)

( * ) Notice: Subject to any disclaimer, the term of this patent is extended or adjusted under 35 U.S.C. 154(b) by 378 days.

(21) Appl. No.: 13/243,575

(22) Filed: Sep. 23, 2011

(65) Prior Publication Data

US 2012/0139118 A1 Jun. 7, 2012

(30) Foreign Application Priority Data

Dec. 1, 2010 (KR) .................. 10-2010-0121246

(51) Int. Cl.
 *H01L 23/04* (2006.01)
 *H01L 25/065* (2006.01)
 *H01L 23/48* (2006.01)

(52) U.S. Cl.
 CPC ......... *H01L 25/0657* (2013.01); *H01L 2224/16* (2013.01); *H01L 2225/06544* (2013.01); *H01L 23/481* (2013.01); *H01L 2225/06513* (2013.01)
 USPC ................... 257/698; 257/774; 257/E23.011; 257/E23.067

(58) Field of Classification Search
 USPC .......... 257/676, 698, 773, 774, 786, E23.011, 257/E23.067, E23.174
 See application file for complete search history.

(56) References Cited

U.S. PATENT DOCUMENTS

| | | | |
|---|---|---|---|
| 7,148,554 B2 * | 12/2006 | Nah et al. ...................... | 257/532 |
| 8,178,976 B2 * | 5/2012 | Dunne et al. ................... | 257/774 |
| 8,330,256 B2 * | 12/2012 | Yoda et al. ..................... | 257/621 |
| 8,507,940 B2 * | 8/2013 | Yu et al. .......................... | 257/99 |

FOREIGN PATENT DOCUMENTS

KR 1020090069487 A 7/2009

* cited by examiner

*Primary Examiner* — Matthew E Warren
(74) *Attorney, Agent, or Firm* — William Park & Associates Ltd.

(57) ABSTRACT

A semiconductor chip includes a substrate having a first surface and a second surface opposite to the first surface, a chip pad disposed on the first surface of the substrate, and a through-silicon via (TSV) including a plurality of sub vias electrically connected to the chip pad at different positions.

8 Claims, 9 Drawing Sheets

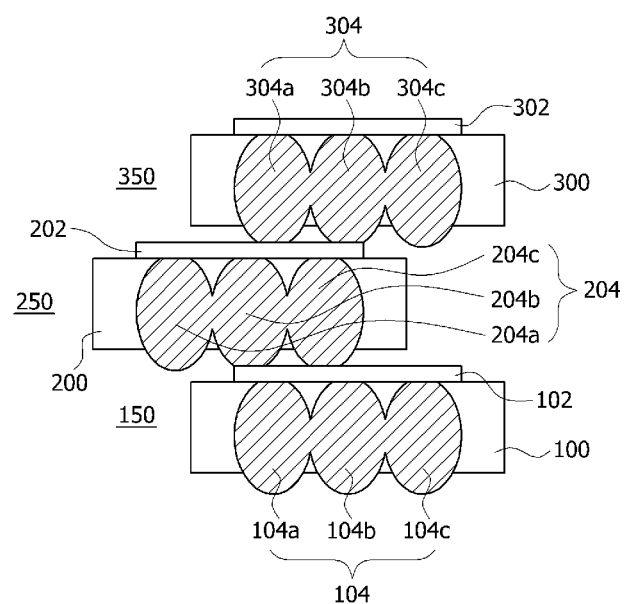
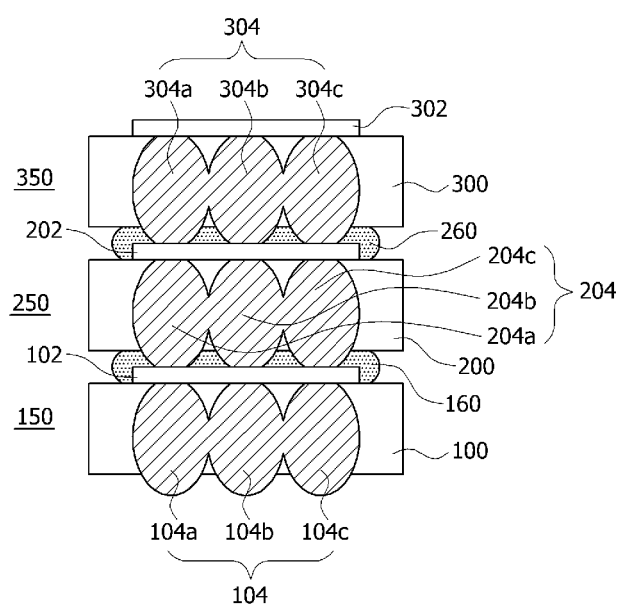

SEMICONDUCTOR CHIP, SEMICONDUCTOR PACKAGE, AND METHOD FOR MANUFACTURING SEMICONDUCTOR CHIP FOR REDUCING OPEN FAILURES

CROSS-REFERENCES TO RELATED APPLICATIONS

The present application claims priority under 35 U.S.C 119(a) to Korean Application No. 10-2010-0121246 filed on Dec. 1, 2010 in the Korean intellectual property Office, which is incorporated herein by reference in its entirety.

BACKGROUND

Exemplary embodiments of the present invention relate to a semiconductor chip, a semiconductor package, and a method for manufacturing the semiconductor chip, and more particularly, to a semiconductor chip including a through-silicon via (TSV) with a plurality of sub vias, a semiconductor package, and a method for manufacturing the semiconductor chip for reducing open failures.

Modern electronic products are much smaller in size and higher in performance than before. With increased demands for mobile electronic products, the demand for ultra-small high-capacity semiconductor memory devices has increased. Increasing the storage capacity of the semiconductor memory device may include increasing the integration degree of a semiconductor chip or mounting and assembling a plurality of semiconductor chips within a single semiconductor package. The former high integration method may require much effort, capital, and time, but the latter packaging method accommodates easier way to increase the storage capacity of the semiconductor memory. The latter packaging method is very advantageous in terms of necessary capital, research, and development effort, and development time, as compared to the former method. Hence, semiconductor memory manufacturers have made many efforts to increase the storage capacity of the semiconductor memory device through a multi chip package which mounts a plurality of semiconductor chips within a single semiconductor package.

Examples of the method of mounting the plurality of semiconductor chips within the single semiconductor package include a method of mounting semiconductor chips horizontally, and a method of mounting semiconductor chips vertically. However, due to characteristics of electronic products which tend to be smaller in size, most semiconductor memory manufacturers prefer a stack type multi chip package in which semiconductor chips are stacked vertically. A stack chip package technique can reduce manufacturing costs of a package due to a simplified process and is advantageous to mass production. However, the stack chip package technique has a disadvantage in that an interconnection space for internal electrical connection of the package is insufficient due to the increase in the number and size of stacked chips. Considering these points, a package structure using a through-silicon via (TSV) has been proposed as one example of a stack package. Such a package is manufactured by forming TSVs within chips at a wafer level and coupling the chips physically and electrically in a vertical direction by the TSVs.

In general, a TSV is formed in correspondence to a chip pad of a semiconductor chip. In this case, an open failure occurring in a TSV may result in an entire failure of a semiconductor chip or a semiconductor package. The open failure of the TSV may be solved by widening the width (cross-sectional area) of the TSV. However, since TSVs should not be formed where various semiconductor devices are formed, there is a limit to widening the width (cross-sectional area) of the TSVs.

SUMMARY

An embodiment of the present invention is directed to a semiconductor chip including a TSV with a plurality of sub vias electrically connected together in order to reduce open failures, a method for manufacturing the semiconductor chip, and a semiconductor package.

In one embodiment, a semiconductor chip includes: a substrate having a first surface and a second surface opposite to the first surface; a chip pad disposed on the first surface of the substrate; and a through-silicon via (TSV) including a plurality of sub vias electrically connected to the chip pad at different positions. The plurality of sub vias may be, for example, directly connected to the chip pad.

At least one of the sub vias may protrude outward from the second surface of the substrate.

The cross-sectional area of at least one of the sub vias may gradually increase from the first surface and the second surface to a center portion of the substrate, and the sub vias may be electrically connected together where at least one of the sub vias is at its widest.

At least one of the sub vias may include a column portion whose cross-sectional area is constant, and a convex portion whose cross-sectional area is larger than the cross-sectional area of the column portion, and the sub vias may be electrically connected together at the convex portion.

The cross-sectional areas of the sub vias may gradually increase from the first surface to the second surface of the substrate.

The sub via may be formed of a conductive material comprising one or more of gold (Au), silver (Ag), copper (Cu), aluminum (Al), nickel (Ni), tungsten (W), titanium (Ti), platinum (Pt), palladium (Pd), tin (Sn), lead (Pb), zinc (Zn), indium (In), cadmium (Cd), chromium (Cr), molybdenum (Mo), and organic material.

The sub via may include a TSV and a blind via, which are electrically connected together through a micro channel within the substrate.

In another embodiment, a semiconductor package includes at least one semiconductor chip each including: a substrate having a first surface and a second surface opposite to the first surface; a chip pad disposed on the first surface of the substrate; and a through-silicon via (TSV) including a plurality of sub vias electrically connected to the chip pad at different positions.

In another embodiment, a method for manufacturing a semiconductor chip includes: forming a plurality of openings spaced apart from one another and directed from a first surface to a second surface of a substrate; expanding the openings so that sides thereof expand to adjacent openings; and filling the openings with conductive material.

The forming of the plurality of openings spaced apart from one another may be performed by an anisotropic etch process.

The expanding of the openings may be performed by an isotropic etch process.

The isotropic etch process may be performed by a wet etch process.

The wet etch process may be performed using a buffered hydrofluoric acid (BHF) solution or an etch solution in which nitric acid (HNO3) and fluoric acid (HF) are mixed with water or acetic acid (CH3COOH).

The isotropic etch process may be a dry etch process using gas containing fluorine (F).

The method may further include forming an insulation layer on the surfaces of the openings before the openings are filled with the conductive material.

The method may further include forming a seed metal layer on the surfaces of the openings before the openings are filled with the conductive material.

The forming of the seed metal layer on the surfaces of the openings may be performed by an electroless plating process.

The filling of the openings with the conductive material may be performed by a vacuum deposition process, a sputtering process, a chemical vapor deposition (CVD) process, an electroless plating process, an electroplating process, a dispense process, or a screen printing process.

BRIEF DESCRIPTION OF THE DRAWINGS

The above and other aspects, features and other advantages will be more clearly understood from the following detailed description taken in conjunction with the accompanying drawings, in which:

FIG. 12 is a cross-sectional view of a semiconductor package according to an embodiment of the present invention; and FIG. 13 a cross-sectional view of a semiconductor package according to another embodiment of the present invention.

DESCRIPTION OF SPECIFIC EMBODIMENTS

Hereinafter, embodiments of the present invention will be described with reference to accompanying drawings. However, various embodiments are for illustrative purposes only and are not intended to limit the scope of the invention.

Figure 1:
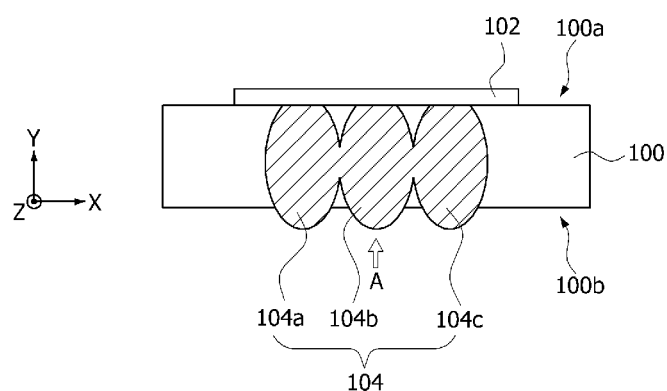
FIG. 1 is a cross-sectional views of a semiconductor chip according to an embodiment of the present invention.

A semiconductor chip according to an embodiment of the present invention will be described below with reference to FIG. 1. Referring to FIG. 1, the semiconductor chip according to an embodiment of the present invention includes a substrate 100, a chip pad 102, and a TSV 104 composed of a plurality of sub vias 104a, 104b and 104c electrically connected to the chip pad 102.

The substrate 100 has a first surface 100a and a second surface 100b opposite to the first surface 100a. The substrate 100 may be a substrate in which interconnections are formed on a backing material such as silicon (Si), GaAs, LiTaO₃, LiNbO₃, or sapphire, or may be a package substrate which electrically connects a semiconductor chip inside a package to an external printed circuit board (PCB) and supports the semiconductor chip, or may be a typical PCB itself. For ease of explanation only, the following description will be focused on a case in which the substrate 100 is a silicon wafer. However, the essential spirit of the present invention can be applied to substrates formed of other materials for other purposes.

The chip pad 102 may include conductive material such as, for example, gold (Au), silver (Ag), copper (Cu), aluminum (Al), nickel (Ni), tungsten (W), titanium (Ti), platinum (Pt), palladium (Pd), tin (Sn), lead (Pb), zinc (Zn), indium (In), cadmium (Cd), chromium (Cr), and molybdenum (Mo), or other conductive material formed from these metals or organic materials. The chip pad 102 may be formed in a single layer structure or a multilayer structure.

The TSV 104 includes the plurality of sub vias 104a, 104b and 104c directed from the first surface 100a to the second surface 100b of the substrate 100. The sub vias 104a, 104b and 104c may be formed of a material equal to or different from that of the chip pad 102, and may be formed in a single layer structure or a multilayer structure. The sub vias 104a, 104b and 104c are electrically connected at other positions except for the first surface 100a of the substrate 100. FIG. 1 illustrates one embodiment in which the sub vias 104a, 104b and 104c are electrically connected at the center portions thereof because the center portions of the sub vias 104a, 104b and 104c are convex in the cross section (when cut along an XY plane).

FIGS. 2 to 5 are plan views of the second surface 100b in the direction A of FIG. 1 illustrating various embodiments of TSVs.

Figure 2:
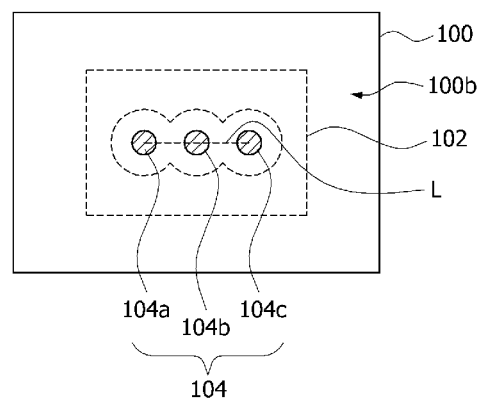
FIGS. 2 to 5 are plan views in a direction A of FIG. 1, illustrating various embodiments of TSVs.
Figure 3:
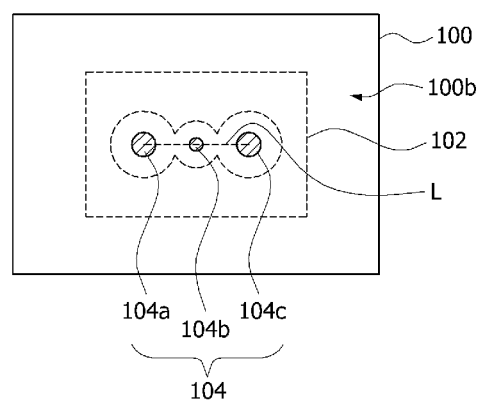
Figure 4:
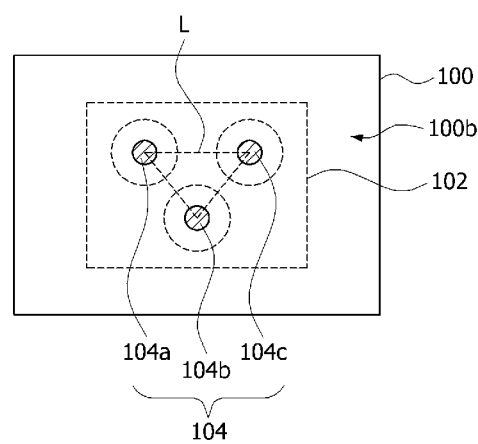
Figure 5:
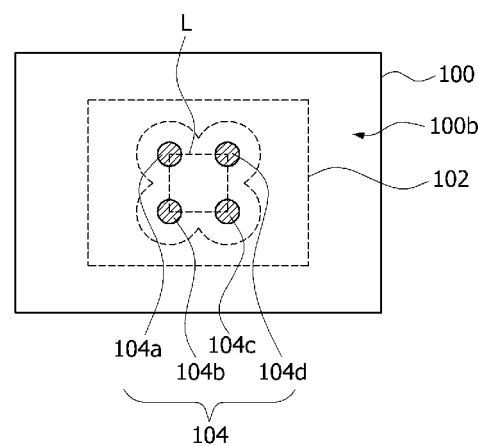

The TSV 104 may include a plurality of sub vias 104a, 104b and 104c that have same diameters in a cross section cut along the XZ plane of FIG. 1 as shown in FIG. 2 or that have different diameters in a cross section cut along the XZ plane of FIG. 1 as shown in FIG. 3. The cross-sectional diameter or shape of a sub via described with respect to FIGS. 2-5 refers to a cross section cut along the XZ plane of FIG. 1. In FIG. 3, the cross-sectional diameter of the sub via 104b provided in between the sub vias 104a and 104c is smaller than those of the sub vias 104a and 104c. The reverse case where the cross-sectional diameters of the sub vias 104a and 104c are smaller than that of sub via 104b is also possible, and further the cross-sectional diameters of sub vias are not just limited to those shown in FIGS. 2-3 but any one or combination among the plurality of sub vias may have different or same cross-sectional diameters from each other. Meanwhile, as shown in FIGS. 2 and 3, a line L connecting the center axes of the sub vias 104a, 104b and 104c may be a straight line. In addition, the line L may be in a triangular shape as shown in FIG. 4, rectangular as shown in FIG. 5, or other polygonal shapes (not shown). Furthermore, the cross-sectional shape of a sub via may be of any useable shape including circular, oval, or polygonal, such as triangular, rectangular, etc.

FIGS. 6 to 10 show cross-sectional views illustrating a partial configuration of a semiconductor chip according to various embodiments of the present invention.

Figure 6:
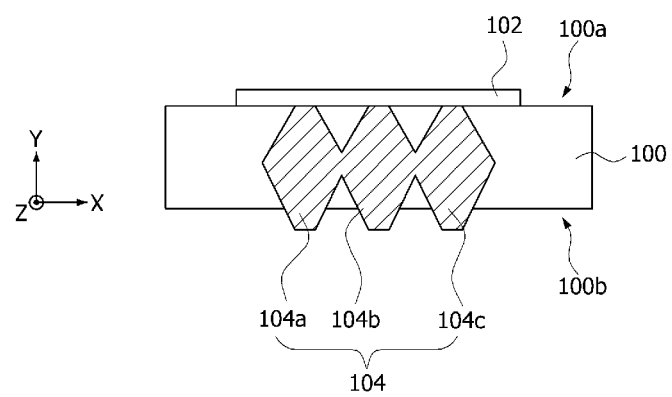
FIGS. 6 to 10 are cross-sectional views illustrating a partial configuration of a semiconductor chip according to another embodiment of the present invention.

The cross-section shown in FIG. 6 is similar to that of FIG. 1 in that a cross-sectional area cut along the XZ plane of FIG. 6 of the sub vias 104a, 104b and 104c constituting the TSV 104 gradually increases from the second surface 100b toward the center portion of the substrate 100 and gradually decreases from the center portion toward the first surface 100a of the substrate 100. However, the cross section may be formed of straight lines in FIG. 6 while it is formed of curved lines in FIG. 1. That is, while the sub via illustrated in FIG. 1 has an oval cross-sectional shape in which both ends are cut, the sub via illustrated in FIG. 6 may have a rhombus cross-sectional shape in which the sectional shape of the sub via gradually increases from the second surface 100b toward the center portion of the substrate 100 and gradually decreases from the center portion toward the first surface 100a of the substrate 100 and both ends thereof are cut.

Figure 7:
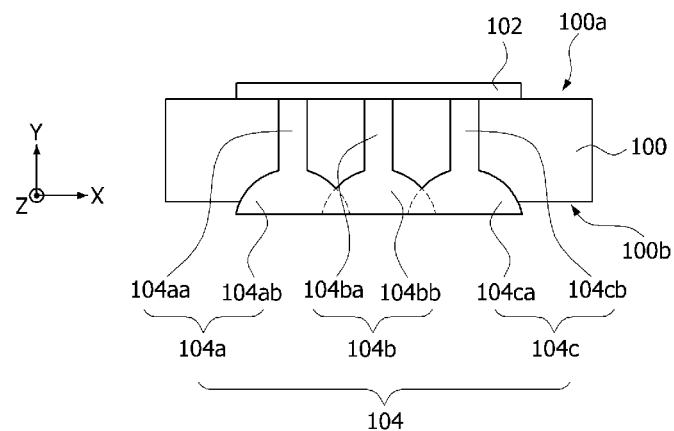

Referring to FIG. 7, the sub vias 104a, 104b and 104c constituting the TSV 104 may include column portions 104aa, 104ba and 104ca, whose cross-sectional areas are constant, and convex portions 104ab, 104bb and 104cb, whose cross-sectional areas are larger than those of the column portions 104aa, 104ba and 104ca. The sub vias 104a, 104*b* and 104*c* may be electrically connected together at the convex portions 104*ab*, 104*bb* and 104*cb*.

Figure 8:
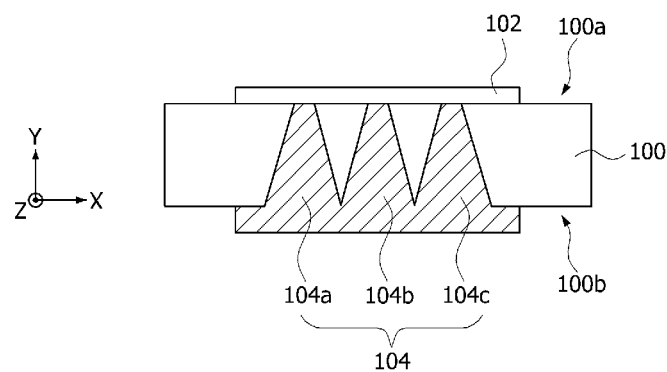

Referring to FIG. 8, the cross-sectional area (the cross-sectional area when cut along an XZ plane) of the sub vias 104*a*, 104*b* and 104*c* constituting the TSV 104 may gradually decrease from the second surface 100*b* to the first surface 100*a* of the substrate 100. The cross-sectional shape of the sub vias 104*a*, 104*b* and 104*c* may be circular, oval, or polygonal, such as triangular, rectangular, etc. In addition, the sub vias 104*a*, 104*b* and 104*c* may be electrically connected at the chip pad 102, and the sub vias 104*a*, 104*b*, and 104*c* may be physically connected at the second surface 100*b*.

Figure 9:
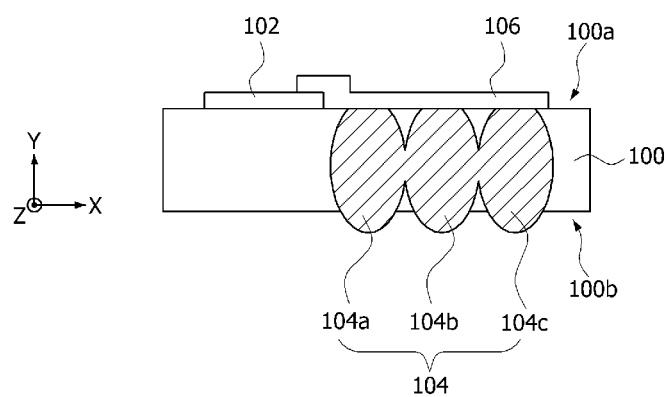

FIG. 9 illustrates a case where the sub vias 104*a*, 104*b* and 104*c* constituting a TSV 104 are not directly connected to the chip pad 102 but are connected to a redistribution line 106. The redistribution line 106 may be formed from material such as, for example, gold (Au), silver (Ag), copper (Cu), aluminum (Al), nickel (Ni), tungsten (W), titanium (Ti), platinum (Pt), palladium (Pd), tin (Sn), lead (Pb), zinc (Zn), indium (In), cadmium (Cd), chromium (Cr), and molybdenum (Mo), or a conductive organic material. The chip pad 102 may be formed in a single layer structure or a multilayer structure.

Figure 10:
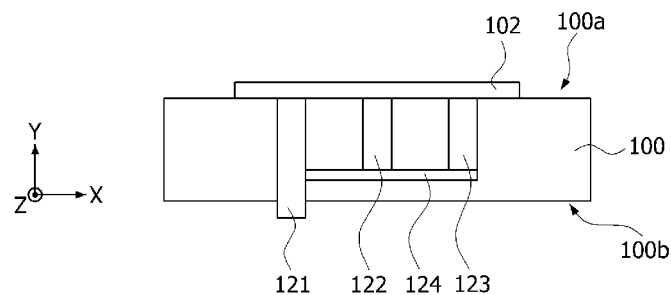

FIG. 10 illustrates an embodiment which includes a blind via and a TSV. The TSV 121 refers to the sub via protruding from the second surface 100*b* of the substrate 100, and the blind via refers to the sub vias connected to the chip pad 102 that do not protrude from the second surface 100*b* of the substrate 100 and are located within the substrate 100. Although one TSV 121 and two blind vias 122 and 123 are illustrated in FIG. 10, there is no limit to the number of the TSV and the blind vias. A micro channel 124 electrically connecting the TSV 121 to the blind vias 122 and 123 is provided within the substrate 100. The blind vias 122 and 123 and the micro channel 123 may include one or more materials such as, for example, gold (Au), silver (Ag), copper (Cu), aluminum (Al), nickel (Ni), tungsten (W), titanium (Ti), platinum (Pt), palladium (Pd), tin (Sn), lead (Pb), zinc (Zn), indium (In), cadmium (Cd), chromium (Cr), and molybdenum (Mo), or a conductive organic material. The blind vias 122 and 123 and the micro channel 123 may be formed in a single layer structure or a multilayer structure.

FIGS. 11A to 11F are cross-sectional views illustrating a method for manufacturing a semiconductor chip according to an embodiment of the present invention.

Referring to FIG. 11, a process of forming a semiconductor device, such as a transistor, an interconnection pattern, and so on is performed on a first surface 100*a* of a substrate 100. A photoresist is coated on the first surface 100*a* of the substrate 100 and is patterned to form photoresist patterns 108.

Figure 11A:
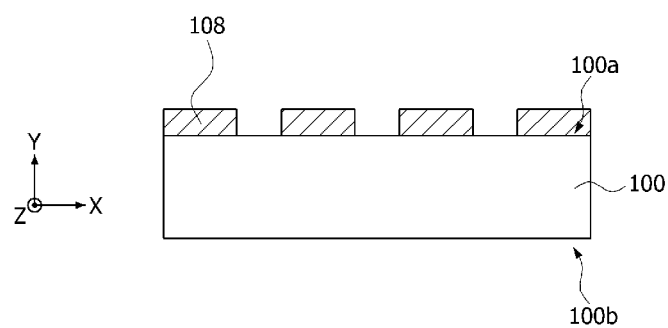
FIGS. 11A to 11F are cross-sectional views illustrating a method for manufacturing a semiconductor chip according to an embodiment of the present invention.
Figure 11B:
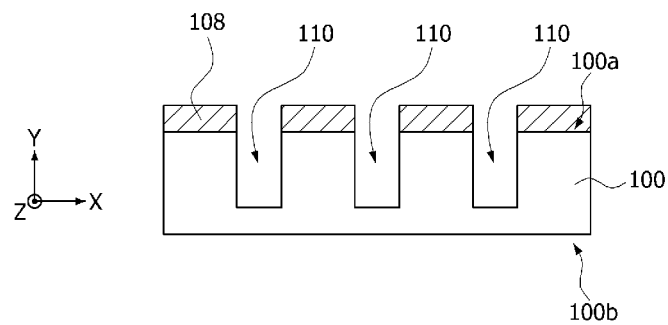

Referring to FIG. 11B, openings 110 are formed by etching the substrate 100 using the photoresist patterns 108 as an etch mask. The openings 110 are spaced apart from one another, and sides thereof are not connected to one another.

The openings 110 may be formed by, for example, a reactive ion etch (RIE) process. In addition, the openings 110 may be formed by, for example, a deep reactive ion etch (DRIE) process and a bosch process. The bosch process induces an anisotropic etch by adding a polymer coating using $C_4F_8$ plasma after $SF_6$ plasma. In general, the bosch process has disadvantages in that scalloping phenomenon occurs to form unevenness on the sides of the openings 110 and a subsequent opening filling process is not effectively performed. However, according to an embodiment of the present invention, no scalloping phenomenon occurs because an opening expansion is subsequently performed. The openings 110 may be formed by a laser etch process. For example, an ND:YAG laser or a $CO_2$ laser may be used, or an UV laser may be used. The laser etch process can process a metal layer at high speed and is effective to a large area. In addition, no lithography is used and no toxic gas is used.

Figure 11C:
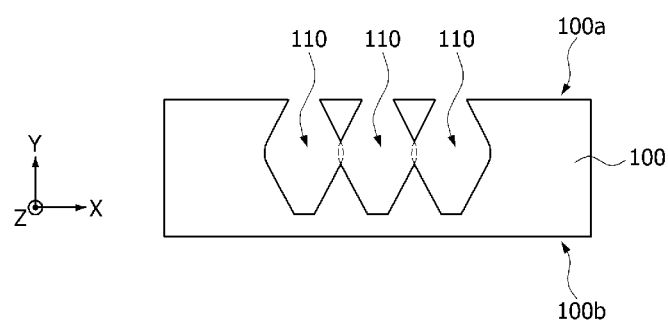

Referring to FIG. 11C, the openings 110 are expanded to connect the sides thereof together. The expansion of the openings 110 may be performed by an isotropic etch process. A wet etch process exhibiting isotropic etch characteristic or an isotropic dry etch process may be used. For example, the openings 110 may be expanded by a wet etch process using an etch solution in which nitric acid ($HNO_3$) and fluoric acid (HF) are mixed with water or acetic acid ($CH_3COOH$). The nitric acid reacts with silicon to generate $SiO_2$, and $SiO_2$ reacts with HF to generate water and $H_2SiF_6$. $H_2SiF_6$ dissolves in water. As another example, a wet etch process using a buffered hydrofluoric acid (BHF) solution may be performed until the sides of the openings 110 are partially connected together. The isotropic dry etch process may be a dry etch process using gas containing $CF_4$, $SF_6$, and fluorine (F). Various embodiments of the invention may use various types of dry etching and wet etching. In a case in which the openings 110 are filled by a plating process after the sides of the openings 110 are connected together by expansion of the openings 110, a coating adhesion can be improved by a chemical or physical process in order to facilitate the plating process.

Figure 11D:
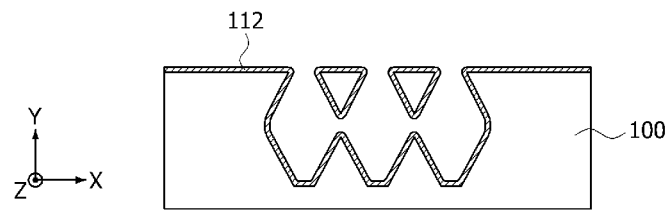

Referring to FIG. 11D, an insulation layer or seed metal layer 112 may be formed on the surfaces of the openings 110. The forming of the insulation layer or seed metal layer 112 may be skipped. The insulation layer 112 may be formed of an insulation material including one or more organic and/or inorganic insulation materials such as, for example, an insulation material including silicon oxide. The forming of the insulation layer 112 may be performed by a general thin film deposition process such as a sputtering process or a chemical vapor deposition (CVD) process. In addition, a coating process such as a spin coating process or a dip coating process, or a thermal oxidation process may be used in order to facilitate the coating on the sides of the expanded openings.

For example, a spin on glass (SOG) material may be used. A silicate SOG material formed by a condensation reaction of $Si(OH)_4$ or siloxane SOG material containing an organic dopant such as —$CH_3$ or —$C_2H_5$ may be used. Such a liquid SOG solution (sol) is coated on the substrate 100 and is spin coated or sol-gel coated to form a uniform film. In addition, a spin on dopant (SOD) in which a dopant is added to a SOG may be used. More specifically, a polysilazane-based SOG material may be used. The polysilazane-based SOG material is basically composed of Si—N bond, Si—H bond, and N—H bond. When such an SOG material is baked in an environment containing oxygen and water, the Si—N bond is substituted by Si—O bond. A silicon oxide film may be easily obtained by coating such an SOG material and performing a subsequent curing process on the coated SOG material. The curing of the SOG material may be performed, for example, by a thermal treatment at a temperature of 500° C. or more, specifically 600° C. or more, for 20 minutes to 1 hour. A detailed temperature and thermal treatment time may be changed depending on a kind of a filling material or applications. A dry process may be performed, for example, at a temperature range from 200° C. to 300° C. before the high-temperature thermal treatment in order for outgassing. Through the process of curing the SOG material, the insulation layer 112 formed of $SiO_2$ may be obtained.

As another example, spin-coatable hydrogen silsesquioxanes (HSQ), methylsilsesquioxane (MSQ), fluorinated silicate glass (FSQ), poly arylene ethers (PAE), bis-benzocyclobutenes (BCB), or fluoro-polyimide (FPI) may be used. The HSQ and the MSQ have a chemical structure of $[RSiO_{3/2}]_n$ (R:H or $CH_3$) in which 1.5 oxygens and one hydrogen or methyl group are connected at each silicon atom. Three alkoxy or halogen groups (—OR, CL), which are bonded to the silicon atom being a monomer, are hydrolyzed into hydroxyl groups (—OH) under water and an acid-base catalyst, and pre-polymer is grown by a condensation between the hydroxyl groups or the alkoxy-hydroxyl groups and composed by a sol-gel reaction. The composed pre-polymer is well dissolved in a general organic solvent. Thus, a thin film having a desired thickness can be obtained by a spin coating process, and a stable low-k thin film can be obtained by a heat curing process. The HSQ and the MSQ can be heat cured at a temperature of approximately 400° C. The BCB has a thermally stable property with a low temperature range of approximately 350° C., and has superior gap-filling property and adhesion property.

As another example, the $SiO_2$ insulation layer can be formed by a thermal oxidation process. When silicon is heated in $O_2$ or $H_2O$ environment, a $SiO_2$ thermal oxide film is formed. As another example, a thin film formed of a metal oxide, such as $SiO_2$, $Al_2O_3$, or $HfO_2$, may be formed by a CVD process or an atomic layer CVD (ALCVD) process.

The seed metal layer 112 may include one or more materials such as, for example, gold (Au), silver (Ag), copper (Cu), aluminum (Al), nickel (Ni), tungsten (W), titanium (Ti), platinum (Pt), palladium (Pd), tin (Sn), lead (Pb), zinc (Zn), indium (In), cadmium (Cd), chromium (Cr), and molybdenum (Mo), or a conductive organic material. The seed metal layer 112 may be formed in a single layer structure or a multilayer structure.

For example, a copper seed metal layer can be formed by an electroless plating process. A plating solution used in an electroless copper plating may include a copper ion source, a pH control agent, or a reducing agent and may further include a surfactant or an ethylenediamine tetraacetic acid (EDTA) as a complexing agent. Examples of the copper ion source may include CuSO4.5.H2O or CuSO4, and example of the pH control agent may include KOH or NaOH. Examples of the reducing agent may include formaldehyde. However, the invention is not limited to the above-mentioned examples. The electroless copper plating may be achieved in such a manner that copper is reduced by the reducing agent (for example, formaldehyde) as expressed in the following chemical formula.

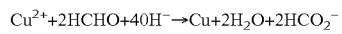

$$Cu^{2+}+2HCHO+4OH^-\rightarrow Cu+2H_2O+2HCO_2^-$$

In addition, a catalyst such as palladium (Pd) or a palladium/tin (Pd/Sn) compound may be used. When pH is increased by the pH control agent (approximately pH 10 or more), a strong reducing action occurs to generate electrons. The electrons flow into copper ions, and the copper ions are precipitated on the palladium catalyst, whereby the copper seed layer can be coated.

Figure 11E:
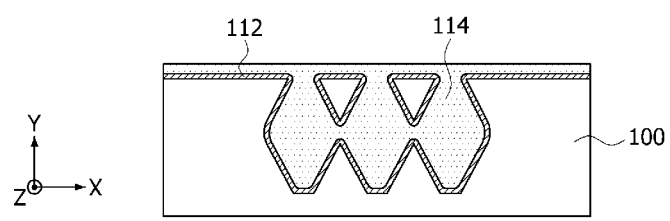

Referring to FIG. 11E, the openings 110 are filled with conductive material 114. The conductive material 114 may include one or more material such as, for example, gold (Au), silver (Ag), copper (Cu), aluminum (Al), nickel (Ni), tungsten (W), titanium (Ti), platinum (Pt), palladium (Pd), tin (Sn), lead (Pb), zinc (Zn), indium (In), cadmium (Cd), chromium (Cr), and molybdenum (Mo), or a conductive organic material. The conductive material 114 may be formed in a single layer structure or a multilayer structure. The openings 110 may be filled by a typical thin film forming process, such as a vacuum deposition process, a sputtering process, a CVD process, etc. In addition, the openings 110 may be filled by an electroless plating process, an electroplating process, a dispense process, or a screen printing process. However, the invention is not limited to the above-mentioned processes.

For example, the openings may be filled by a copper electroplating process. A process of forming a seed metal layer may be added prior to the copper electroplating process. As an example of the copper electroplating process, an electroplating aqueous solution may include a copper ion source, a sulfuric acid ($H_2SO_4$), which controls electrical conductivity, a hydrochloric acid (HCl), which controls a reducing reaction, and may further include other additives. That is, when $CuSO_4$ as the copper ion source is added to a sulfuric acid ($H_2SO_4$) and water, $CuSO_4$ is decomposed into $Cu_{2+}$ ions and $SO_4^{2-}$ ions. After the copper electroplating process, a gold electroplating process may be further performed in order to improve electrical properties. A process of activating the surface of nickel may be first performed in order to help the attachment of gold. The gold-copper components have a weak strength and thus tend to easily wear out. When gold is directly plated on copper, gold components move toward copper components, and copper component move toward gold components. As a result, the original object to improve the conductivity through the gold plating may not be achieved. Thus, a nickel electroplating process may be performed prior to the gold electroplating process. A plating solution for the gold electroplating may use chloroaurate or gold sulfite as a gold source. A cyanic compound or a non-cyanic compound may be added as a complexing agent. However, the invention is not limited to the above-mentioned plating solution for the gold electroplating. There is no limitation to the method of forming the nickel layer by the nickel electroplating. For example, an aqueous solution containing 120-230 g/L $NiSO_4.6H_2O$, 5-35 g/L $NiCl_2$, and 5-35 g/L $H_3PO_4$ or an aqueous solution containing 120-230 g/L $NiSO_4.6H_2O$, 10-30 g/L $Na_4Cl$, and 20-50 g/L $7H_2O$ may be used, and the nickel layer may be formed under conditions that the temperature of the aqueous solution is 25-50° C. and pH is 4-7. However, the invention is not limited thereto.

As another example, a metal paste may be buried by a screen printing process and then dried and sintered to form a sub via filled with a conductive material. The openings may be filled with a conductive material by an electroless plating process.

Figure 11F:
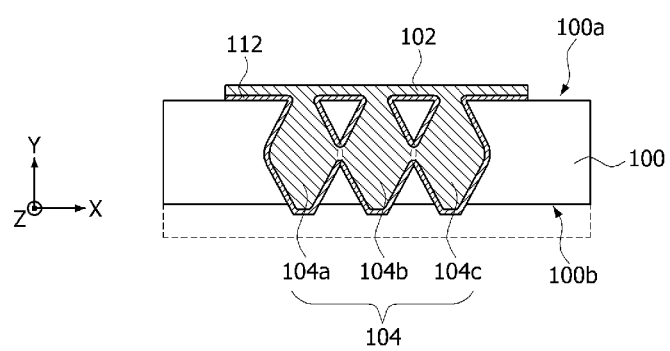

Referring to FIG. 11F, the conductive material 114 is patterned, and the second surface 100b of the substrate 100 is removed to expose the conductive material. A bumping and dicing process may be further performed. The removing of the second surface 100b of the substrate 100 may be performed by a selective etch process while controlling an etch ratio of the conductive material 114 to silicon. Meanwhile, although it is illustrated that the chip pad 102 and the sub vias 104a, 104b and 104c are simultaneously formed, the chip pad 102 may be present prior to the formation of the sub vias 104a, 104b and 104c, or may be formed by a separate forming process after the formation of the sub vias 104a, 104b and 104c.

FIG. 12 is a cross-sectional view of a semiconductor package according to an embodiment of the present invention. Referring to FIG. 12, the semiconductor package according to an embodiment of the present invention is a stack package including a first semiconductor chip 150, a second semiconductor chip 250, and a third semiconductor chip 350. Although it is illustrated in FIG. 12 that three semiconductor chips are stacked, the number of the semiconductor chips is merely exemplary. At least one semiconductor chip may be included.

The first semiconductor chip 150 includes a first TSV 104 with a plurality of first sub vias 104a, 104b and 104c connected to a first chip pad 102. The second semiconductor chip 250 includes a second TSV 204 with a plurality of sub vias 204a, 204b and 204c connected to a second chip pad 202. The third semiconductor chip 350 includes a third TSV 304 with a plurality of sub vias 304a, 304b and 304c connected to a third chip pad 302. Although the first semiconductor chip 150, the second semiconductor chip 250, and the third semiconductor chip 350 may include a plurality of TSVs, one TSV for each semiconductor chip is illustrated for convenience's sake. The semiconductor chips may be the same kind or different kinds.

As such, since the TSVs are configured with the plurality of sub vias electrically connected together, it is possible to prevent an open failure and ensure a process margin, even though a slight misalignment may occur during the stacking of the chips.

FIG. 13 a cross-sectional view of a semiconductor package according to another embodiment of the present invention. Referring to FIG. 13, the semiconductor package according to an embodiment of the present invention includes a first semiconductor chip 150, a second semiconductor chip 250, and a third semiconductor chip 350. Although it is illustrated in FIG. 13 that three semiconductor chips are stacked, the number of the semiconductor chips is merely exemplary. Two or more semiconductor chips may be stacked.

The first semiconductor chip 150 includes a first TSV 104 with a plurality of first sub vias 104a, 104b and 104c connected to a first chip pad 102. The second semiconductor chip 250 includes a second TSV 204 with a plurality of second sub vias 204a, 204b and 204c connected to a second chip pad 202. The third semiconductor chip 350 includes a third TSV 304 with a plurality of third sub vias 304a, 304b and 304c connected to a third chip pad 302. Although the first semiconductor chip 150, the second semiconductor chip 250, and the third semiconductor chip 350 may include a plurality of TSVs, one TSV for each semiconductor chip is illustrated for convenience's sake. The semiconductor chips may be the same kind or different kinds.

The first TSV 104 of the first semiconductor chip 150 may be electrically connected to the second TSV of the second semiconductor chip 250 by the first chip pad 102 and a first solder bump 160. The second TSV 204 of the second semiconductor chip 250 may be electrically connected to the third TSV 304 of the third semiconductor chip 350 by the second chip pad 202 and a second solder bump 260. As illustrated, since the TSVs are configured with the plurality of sub vias electrically connected together, it is possible to improve the adhesion reliability because the solder bumps are penetrated between the sub vias constituting the TSVs during the stacking of the chips.

The solder bumps 160 and 260 may use a Sn—Pb alloy solder or a Sn—Pb—Ag alloy solder. In addition, the solder bumps 160 and 260 may use a Sn—Ag—Cu (SAC) alloy solder having a melting point of 217° C., or other solders.

According to various embodiments of the present invention, the open failure of TSVs may be substantially prevented by forming the TSVs electrically connected by a plurality of sub vias. Consequently, the yield of the semiconductor chip and the semiconductor package can be improved.

Various embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:
1. A semiconductor chip comprising:
a substrate having a first surface and a second surface opposite to the first surface;
a chip pad disposed on the first surface of the substrate; and
a through-silicon via (TSV) including a plurality of sub vias electrically connected the chip pad,
wherein the cross-sectional area of at least one of the sub vias gradually increases from the first surface and the second surface toward a center portion of the substrate, the sub vias being electrically connected together where at least one of the sub vias is at its widest.

2. The semiconductor chip of claim 1, wherein at least one of the plurality of sub vias protrude from the second surface of the substrate.

3. The semiconductor chip of claim 1, wherein the sub via is formed of a conductive material comprising one or more of gold (Au), silver (Ag), copper (Cu), aluminum (Al), nickel (Ni), tungsten (W), titanium (Ti), platinum (Pt), palladium (Pd), tin (Sn), lead (Pb), zinc (Zn), indium (In), cadmium (Cd), chromium (Cr), molybdenum (Mo), and organic material.

4. The semiconductor chip of claim 1, wherein the plurality of sub vias are directly physically connected to the chip pad.

5. A semiconductor chip comprising:
a substrate having a first surface and a second surface opposite to the first surface;
a chip pad disposed on the first surface of the substrate; and
a through-silicon via (TSV) including a plurality of sub vias electrically connected the chip pad,
wherein at least one of the sub vias comprise a column portion whose cross-sectional area is constant, and a convex portion whose cross-sectional area is larger than the cross-sectional areas of the column portion, the sub vias being electrically connected together at the convex portion.

6. The semiconductor chip of claim 5, wherein at least one of the plurality of sub vias protrude from the second surface of the substrate.

7. The semiconductor chip of claim 5, wherein the sub via is formed of a conductive material comprising one or more of gold (Au), silver (Ag), copper (Cu), aluminum (Al), nickel (Ni), tungsten (W), titanium (Ti), platinum (Pt), palladium (Pd), tin (Sn), lead (Pb), zinc (Zn), indium (In), cadmium (Cd), chromium (Cr), molybdenum (Mo), and organic material.

8. The semiconductor chip of claim 5, wherein the plurality of sub vias are directly physically connected to the chip pad.

* * * * *